United States Patent
Zaidi et al.

(10) Patent No.: US 8,093,474 B2
(45) Date of Patent: Jan. 10, 2012

(54) METALLIC NANOSPHERES EMBEDDED IN NANOWIRES INITIATED ON NANOSTRUCTURES AND METHODS FOR SYNTHESIS THEREOF

(75) Inventors: Saleem Zaidi, Albuquerque, NM (US); Joseph W. Tringe, Walnut Creek, CA (US); Ganesh Vanamu, Sunnyvale, CA (US); Rajiv Prinja, Albuquerque, NM (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 460 days.

(21) Appl. No.: 12/051,681

(22) Filed: Mar. 19, 2008

(65) Prior Publication Data

US 2008/0230763 A1    Sep. 25, 2008

Related U.S. Application Data

(60) Provisional application No. 60/919,589, filed on Mar. 23, 2007.

(51) Int. Cl.
    *H01L 21/326* (2006.01)
(52) U.S. Cl. ........ 977/762; 977/938; 977/943; 977/856; 438/466; 438/507
(58) Field of Classification Search ...... 257/9; 997/762, 997/856; 977/762
    See application file for complete search history.

(56) References Cited

U.S. PATENT DOCUMENTS 6,656,568 B1  12/2003  Winningham et al.
6,861,221 B2   3/2005  Mirkin et al.
2004/0018416 A1 *  1/2004  Choi et al. ............ 429/44
2006/0188774 A1 *  8/2006  Niu et al. .............. 429/44
2007/0192911 A1 *  8/2007  Xin et al. .............. 977/876

FOREIGN PATENT DOCUMENTS

WO    WO 2006078952 A1 *  7/2006

OTHER PUBLICATIONS

"Supplementary Information" 2006 Nature Publishing Group.
Englander et al. "Electric-Field Assisted Growth and Self-Assembly of Intristic Silicon Nanowires" Nano Letters, 2005, vol. 5, No. 4, 705-708.
Hu et al. "Photosensitive Gold-Nanoparticle-Embedded Dielectric Nanowires" Nature Materials, Feb. 2006, vol. 5, 102-106.
Paulose et al. "Synthesis of Gold-Silica Composite Nanowires through Solid-Liquid-Solid Phase Growth" Journal of Nanoscience, 2003 vol. 3, No. 4.
Ostraat et al. "Nanoengineered silicon/silicon dioxide nanoparticle heterostructures" Solid State Sciences 7 (2005) 882-890.
King et al. "MOS Memory Using Germanium Nanocrystals Formed by Thermal Oxidations of Si1-xGex" 1998,IEEE Proceedings.

* cited by examiner

*Primary Examiner* — Ajay K Arora
(74) *Attorney, Agent, or Firm* — Eddie E. Scott

(57) ABSTRACT

A nanostructure includes a nanowire having metallic spheres formed therein, the spheres being characterized as having at least one of about a uniform diameter and about a uniform spacing there between. A nanostructure in another embodiment includes a substrate having an area with a nanofeature; and a nanowire extending from the nanofeature, the nanowire having metallic spheres formed therein, the spheres being characterized as having at least one of about a uniform diameter and about a uniform spacing there between. A method for forming a nanostructure is also presented. A method for reading and writing data is also presented. A method for preparing nanoparticles is also presented.

33 Claims, 11 Drawing Sheets

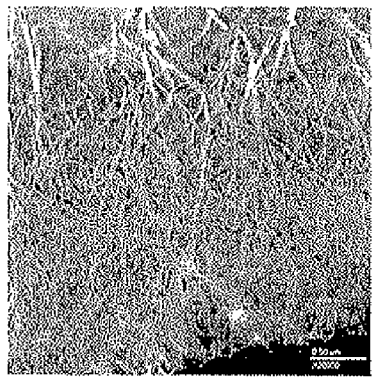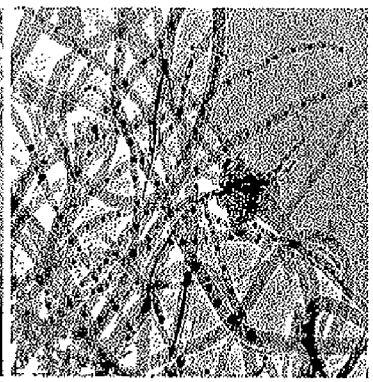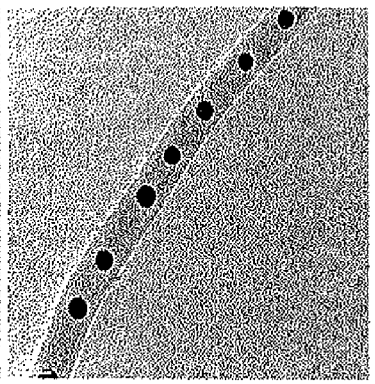
FIG. 3A    FIG. 3B    FIG. 3C
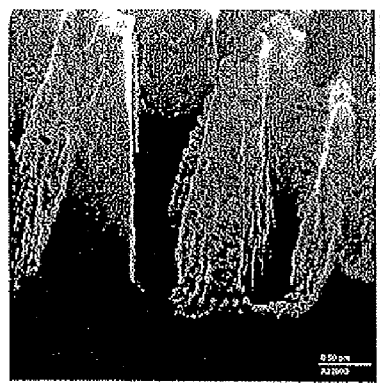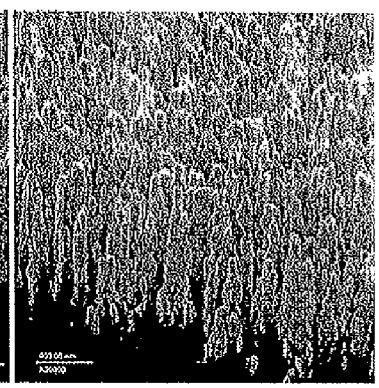
FIG. 3D    FIG. 3E
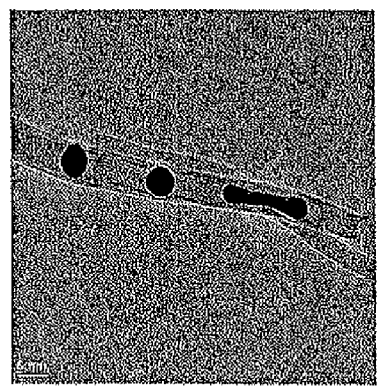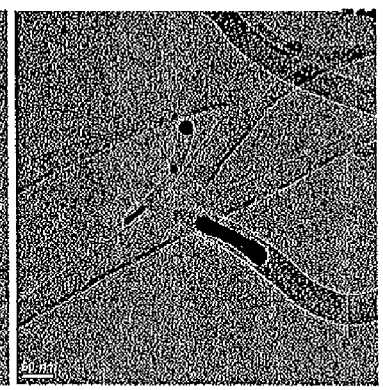
FIG. 3F    FIG. 3G

METALLIC NANOSPHERES EMBEDDED IN NANOWIRES INITIATED ON NANOSTRUCTURES AND METHODS FOR SYNTHESIS THEREOF

RELATED APPLICATIONS

This application claims priority to Provisional U.S. Appl. No. 60/919,589 filed on Mar. 23, 2007, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to nanospheres and nanowires, and more particularly, this invention relates to metallic nanospheres, metallic nanospheres embedded in nanowires, and methods for making and using the same.

BACKGROUND OF THE INVENTION

Several methods have been investigated for synthesis of nanoparticles, such as ion implantation and annealing, or thermal decomposition of precursor gases. However, invariably there is the difficulty of ensuring the uniformity of nanoparticles size and inter-particle separation in the final device. Therefore, a method of synthesis for gold and other metal nanospheres embedded in an insulating matrix with great control over size, particle separation, and insulator thickness is favorable. Additionally, the control over nanosphere/nanowire synthesis location and orientation that allows finished MOS memory devices to be created in dense or sparse arrays would also be favorable.

Numerous methods have been developed for synthesis of semiconductor and metal nanoparticles. For example, highly luminescent semiconductor (CdSe, ZnS) quantum dots have been synthesized in ZrO, —SiO, hybrid sol-gel films using an organometallic approach. Traditionally, colloidal suspensions of metal nanoparticles have been formed by citrate reduction in aqueous solutions. In colloidal suspensions, the major difficulty is to achieve highly mono dispersive size distribution. Even so, gold particles in ~1-200 nm diameter range are commercially available (Nanoprobes, Goldmark Biologicals). A tight size distribution has been observed for each of two assemblies analyzed. Closely-packed, self-assembled mono-layers of alkanethiol stabilized nanoparticles have also been reported using solvent evaporation. In this case, the length of the organic ligand defines the interparticle separation. Finally, self-assembly methods in combination with advanced lithography methods have also been reported.

SUMMARY OF THE INVENTION

A nanostructure according to one embodiment comprises a substrate having an area with a nanofeature; and a nanowire extending from the nanofeature, the nanowire having metallic spheres formed therein, the spheres being characterized as having at least one of about a uniform diameter and about a uniform spacing there between.

A method for forming a nanostructure according to another embodiment comprises depositing metal onto a substrate having nanofeatures; and heating the metal and nanofeatures for inducing growth of nanowires, the nanowires having metallic spheres formed therein.

A method for reading and writing data according to yet another embodiment comprises during a write operation, in a nanostructure comprising a plurality of metallic spheres surrounded by an electrically insulating material, applying a charge to selected spheres; and during a read operation, detecting presence or absence of a charge on the metallic spheres, the presence of a charge being associated with one binary value, the absence of a charge being associated with another binary value.

A method for preparing nanoparticles according to one embodiment comprises etching nanostructures comprising metallic spheres surrounded by a material, the etching at least partially reducing a thickness of the material, thereby forming nanoparticles or nanoparticle precursors.

A nanostructure according to yet another embodiment comprises a nanowire having metallic spheres formed therein, the spheres being characterized as having at least one of about a uniform diameter and about a uniform spacing there between.

Other aspects, advantages and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 3A is an SEM cross-sectional profile of typical self-assembled gold nanospheres in silicon oxide and some $SiO_2$ nanowires without gold nanospheres.

FIG. 3B is a high resolution TEM cross-sectional profile of typical profiles of self-assembled gold nanospheres in silicon oxide and some $SiO_2$ nanowires without gold nanospheres.

FIG. 3C is a high resolution TEM cross-sectional profile of an $SiO_2$ nanowire with gold nanospheres spaced out along the length of the nanowire.

FIG. 3D is an SEM picture of as-deposited gold film on a microstructured silicon surface.

FIG. 3E is an SEM picture of as-deposited gold film on a nanostructured silicon surface.

FIG. 3F is a TEM cross-sectional profile of $Au/SiO_2$ nanowires with inconsistent gold nanoparticle formation.

FIG. 3G is a TEM cross-sectional profile of $Au/SiO_2$ nanowires with inconsistent gold nanoparticle formation.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

The following description discloses several preferred embodiments of methods for controlled synthesis of uniformly distributed metallic nanospheres embedded in nanowires. Resulting products and applications thereof are also presented.

In one general embodiment, a nanostructure comprises a nanowire having metallic spheres formed therein, the spheres being characterized as having at least one of the following characteristics: approximately a uniform diameter, and approximately a uniform spacing between the spheres.

In another general embodiment, a method for forming a nanostructure comprises depositing metal onto a substrate having nanofeatures; heating the metal and nanofeatures for inducing growth of nanowires, with the nanowires having metallic spheres formed therein.

In another general embodiment, a method for reading and writing data comprises applying a charge and detecting presence or absence of a charge. Writing data comprises, during a write operation, applying a charge to selected spheres in a nanostructure comprising a plurality of metallic spheres surrounded by an electrically insulating material. Reading data comprises, during a read operation, detecting presence or absence of a charge on the metallic spheres, the presence of a charge being associated with one binary value, and the absence of a charge being associated with another binary value.

In a further general embodiment, a method for preparing nanoparticles comprises etching nanostructures comprising metallic spheres surrounded by a material, the etching at least partially reducing a thickness of the material.

Figure 1A:
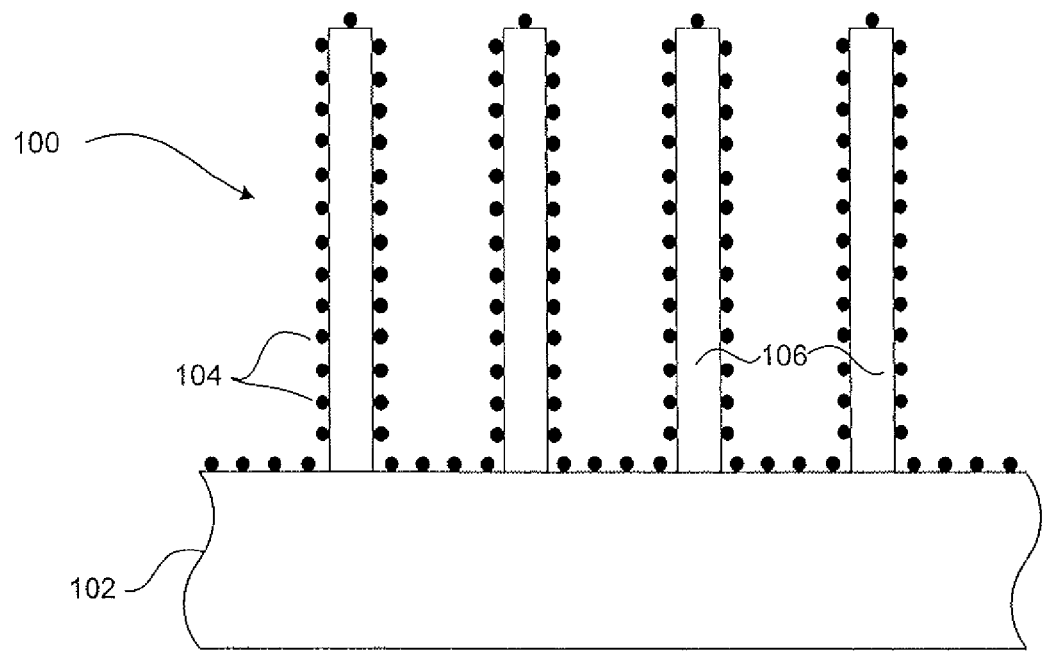
FIG. 1A is an illustrative diagram of the first operation in formation of gold nanospheres in $SiO_2$ nanowires according to one embodiment.
Figure 1B:
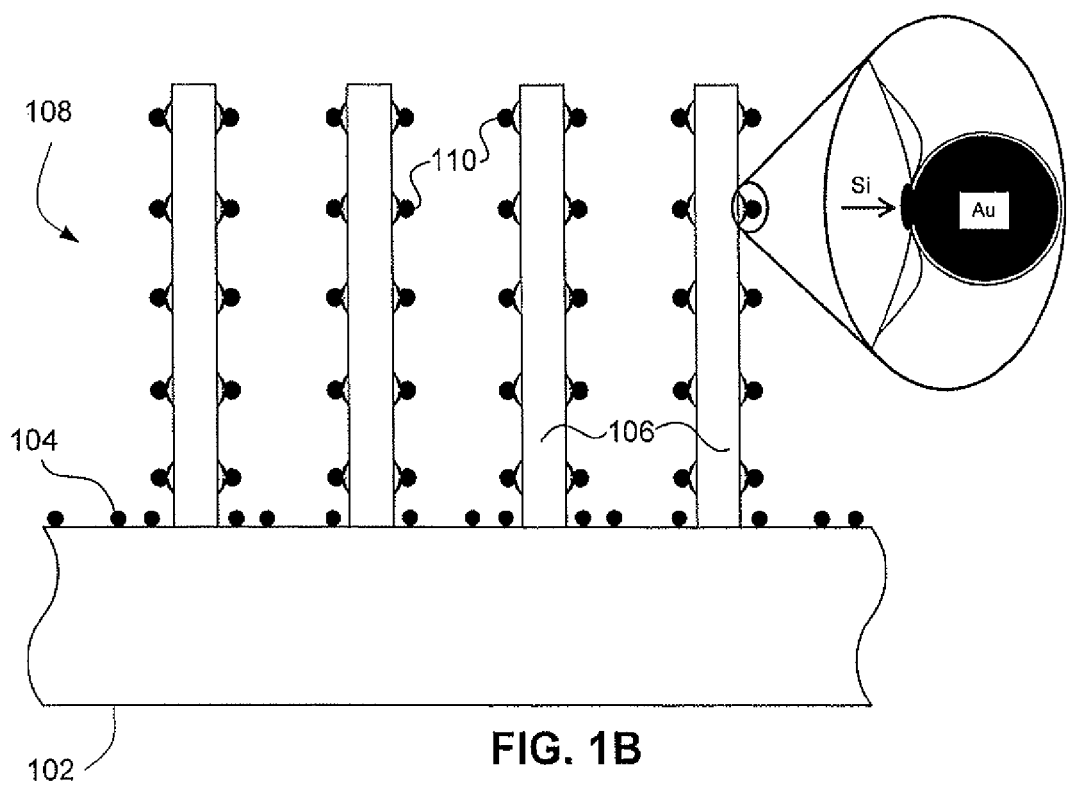
FIG. 1B is an illustrative diagram of the second operation in formation of gold nanospheres in $SiO_2$ nanowires according to one embodiment.
Figure 1C:
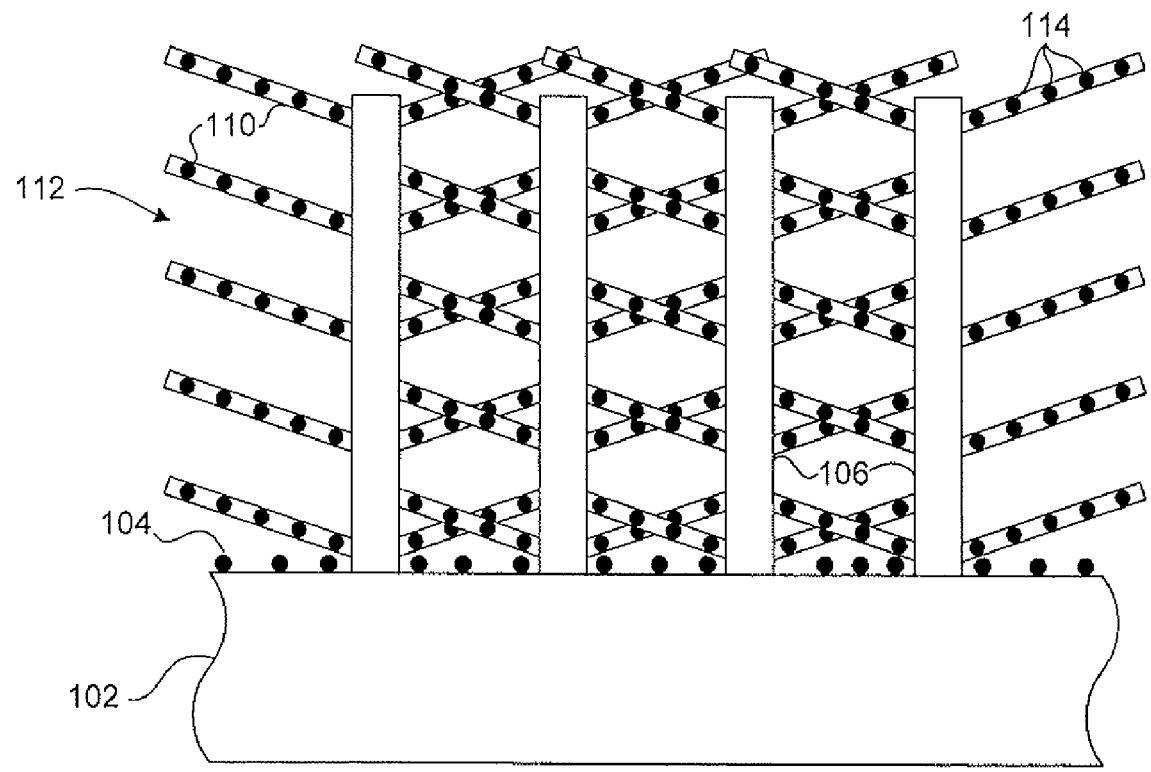
FIG. 1C is an illustrative diagram of the third operation in formation of gold nanospheres in $SiO_2$ nanowires according to one embodiment.

Nanowire synthesis in one embodiment is schematically described by simplified structural drawings shown in FIGS. 1A-1C. Particularly, FIGS. 1A-1C show the sequence of processing steps in formation of metallic nanospheres in nanowires.

FIG. 1A is an illustrative diagram of the first operation in formation of metallic nanospheres in nanowires. In FIG. 1A, a nanostructured metallic film 104 is deposited on nanostructured surfaces 106 which extend from a substrate 102. This metallic film may be an island film, full film, selectively deposited film, etc. As this metallic-coated structure is heated in air, the substrate and metal melt to form structure as shown in FIG. 1B. This process may also be carried out in other environments such as an argon- or nitrogen-rich gaseous environment. The metallic film may include any type of metal, such as gold, silver, palladium, copper, etc., that forms metal nanospheres in nanowires.

For illustrative purposes, and in no way limiting the scope of the invention, much of the following description shall refer to gold as a metal in the metallic film 104, and silicon as the substrate 102 which forms silicon oxide and/or silicon dioxide nanowires when heated in an environment including air or other gases.

In this particular embodiment, FIG. 1A is an illustrative diagram of the first operation in formation of gold nanospheres in $SiO_2$ nanowires. In FIG. 1A, a discontinuous nanostructured gold island film 104 is deposited on nanostructured silicon surfaces 106 which are extending from a silicon substrate 102. As this gold-coated structure is heated in air, silicon and gold melt to form structures 110 as shown in FIG. 1B.

Once again, using gold and silicon as examples, FIG. 1B is an illustrative diagram of an intermediate step in the formation of gold nanospheres in SiO and/or $SiO_2$ nanowires. In FIG. 1B, silicon and gold nanostructures 110 are initiated, extending from the nanostructured silicon surfaces 106. Some of the discontinuous nanostructured gold film 104 may be left on the silicon substrate 102 during this step.

At high temperatures (~1000° C.) silicon precipitates out of this Au/Si alloy and is rapidly oxidized. At the same time, the Au/Si alloy 110 is converted into gold nanospheres 114 embedded in $SiO_2$ nanospheres 116 as shown in FIG. 1C. The mechanism described is well supported by the transmission electron microscope (CEM) analysis of $Au/SiO_2$ nanowires shown in FIG. 3C. FIGS. 3F and 3G show some continuous Au/Si features that have not been converted into individual spheres.

Gold nanosphere formation in $SiO_2$ nanowires may provide several advantages in various embodiments: (a) the Au/nanowire structures are highly organized, (b) Si nanostructures may act as catalysts (see FIGS. 3A-3E), (c) nanosphere growth may be carried out in air, and (d) preliminary experiments with gold films show good structures are achieved with ~5 nm thick films as well as with other thicknesses.

It is not clear why gold nanospheres are formed with such precise dimensions and separation, though minimization of surface energy is clearly important. At higher temperatures, Si is oxidized, and individual gold nanospheres are defined with precise diameters and spacing. Curvature-induced melting temperature lowering plays a role in creating structures that are so highly irregular at macroscopic level yet highly organized at nano level.

In another approach, the nanowires are comprised of an electrically insulative material that at least partially surrounds the metallic spheres. Furthermore, the electrically insulative material may be an oxide or a nitride. Also, the nanowires may be formed from the substrate material itself.

Figure 2:
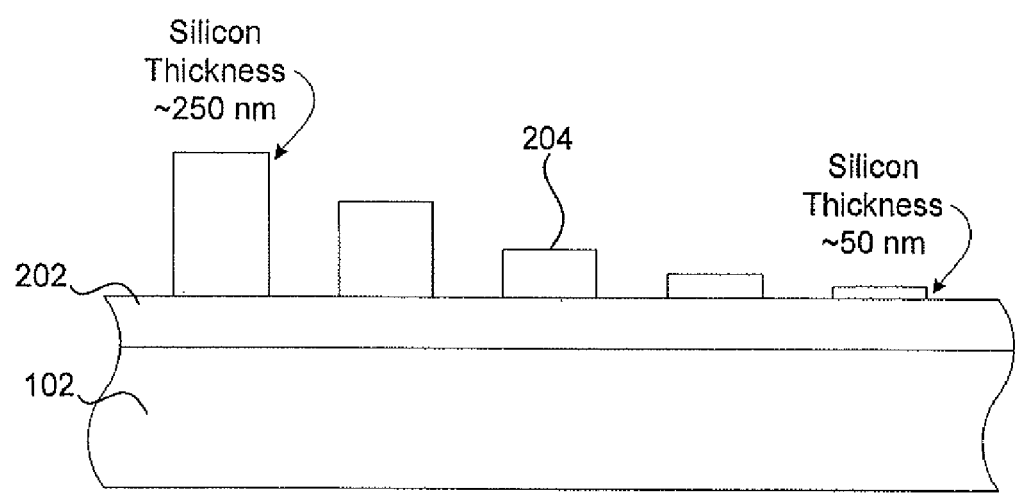
FIG. 2 is a cross-sectional diagram of varying silicon substrate thickness.

The nanostructured surface may have varying sizes and shapes. As an example, FIG. 2 illustrates another approach where more than one nanostructured surface thickness is used to promote nanowire growth. In one particular embodiment, gold is used as the metal and silicon is used as the substrate. FIG. 2 illustrates a silicon substrate 102 having a $SiO_2$ film 202 on a surface, with silicon structures 204 protruding therefrom with varying thicknesses between about 50 nm to about 250 nm in thickness that can be used to grow $SiO_2$ nanowires therefrom.

FIG. 3A is a scanning electron microscope (SEM) cross-sectional profile of typical self-assembled gold nanospheres in silicon oxide and some $SiO_2$ nanowires without gold nanospheres.

FIG. 3B is a high resolution TEM cross-sectional profile of typical profiles of self-assembled gold nanospheres in silicon oxide and some $SiO_2$ nanowires without gold nanospheres.

FIG. 3C is a high resolution TEM cross-sectional profile of an $SiO_2$ nanowire with gold nanospheres spaced out along the length of the nanowire.

FIG. 3D is an SEM picture of as-deposited gold film on a microstructured silicon surface. FIG. 3E shows an SEM picture of as-deposited gold film on a nanostructured silicon surface. After annealing in air at 1000° C. for approximately 30 minutes, nanowires are typically formed on the nanostructured surfaces as shown in FIG. 3E, but not on microstructured surfaces as shown in FIG. 3D. The behavior of gold films on planar and microstructured surfaces is consistent with island formation. However, with nanostructured silicon, the physical characteristics are different than bulk material including a lowered melting point. For metal island films, similar lowering in melting point as a function of particle size has also been reported. Without wishing to be bound by any theory, it is believed that both silicon and gold melt to form super-saturated Au/Si islands from which silicon grows out to be rapidly oxidized into $SiO_2$ nanowires.

Following is a hypothesis attempting to explain the foregoing phenomenon.

Formation of Silica Nanowires on Si Nanostructures

To understand how nanospheres form, the quantity of Au distributed in silica nanowires is estimated. It is assumed that the nanowires can be modelled simply as embedded Au spheres in a cylinder of silica. A repeating wire segment can be described as a gold sphere inside of a silica right cylinder with radius $R_{silica}$, where the cylinder has a total length of six times the Au sphere radius, $R_{Au}$. The volume fraction of Au, $V_{Au}/V_{silica}$, can then be estimated as:

$$\frac{V_{Au}}{V_{silica}} = \frac{\frac{4}{3}\pi R_{Au}^3}{(\pi R_{silica}^2) \times 6R_{Au} - \frac{4}{3}\pi R_{Au}^3} \quad (1)$$

Although there can be some variation in wire radius, experimentally it has been found that Eq. (1) reduces to 5-10% for all observed wires.

For 2000-nm length wires with 5 and 24 nm spheres, the Au/Si volume ratio implies Au precursor islands with diameters of 12 and 35 nm, respectively. This is consistent with previous observations of planar surfaces where nanoscale Au islands of similar dimensions are formed from semi-continuous thin films at low annealing temperatures. For example, Au islands have been observed to form from a ~10 nm thick Au film on planar Si heated to 200° C. for ~10 minutes. Also, Au nanoparticles have been shown to develop in just 30 minutes in a Si/Au system at 250° C.

The size of the Au islands is similar on the Si micro- and nano-structured substrates since both had comparable amounts of Au deposited on their surfaces. Why then do the nanowires form exclusively on nanostructured substrates? Nanowire formation is favoured when the nanostructured Si is near its melting temperatures. Since the bulk melting temperature of Si is 1414° C., the melting temperature of Si must be significantly reduced for nanowire formation to proceed at 1000° C. In fact, such melting point lowering has been observed: Si islands on silica that are between 80 and 300 nm wide have been melted at ~1110° C. Where the Si nanostructured features have typical radii of less than 100 nm, these will be significantly relaxed, if not melted, at 1000° C., enough to allow efficient diffusion of Si into Au, thus initiating the nanowire formation process.

In a particularly preferred approach, silicon oxide nanowires are formed on Si nanostructures by a vapor-liquid-solid (VLS) process, with oxygen as the primary species provided in the gas phase for nanowire growth. Oxide growth is tremendously accelerated in the presence of Au because the Au/Si alloy is much more efficient at delivering Si for oxide growth relative to a solid Si surface. A temperature of ~1100° C. is required to form a 100-nm thick oxide layer on Si in 20 minutes. However, for an Au/Si surface, the same thickness oxide film can be grown at only ~250° C. in air in comparable time.

It is believed that silica nanowires form as shown in FIG. 1B. First, Au islands develop on nanostructured Si substrates as described herein, and the enhanced rate of Si oxidation at the edges of Au islands pushes the Au island above the surface of the Si. As annealing continues for longer durations and higher temperatures, more Si diffuses through the central channel into the Au reservoir in quantities sufficient to sustain subsequent nanowire growth. For example, assuming 1:2 Si:O stoichiometry in the nanowire, and all Si provided by the substrate, the Au/Si reservoir diameters would initially be ~50 and 130 nm for nanowires with 5 and 24-nm diameter Au nanospheres, respectively, just prior to nanowire initiation. A significant quantity of Si must originate from the substrate; otherwise nanowires would form on microstructured Si surfaces. However, since the possibility that some Si is provided by the vapor phase cannot be excluded, these reservoir diameters represent upper bounds. Wire diameters are determined by the size of the Au/Si reservoir, with larger-diameter wires created by larger-diameter reservoirs.

Next, nanowires grow from the reservoir. At a temperature of ~1000° C. the Au/Si alloy reservoir must be liquid to facilitate nanowire formation. Silica growth at the base of the liquid Au/Si alloy reservoir forms a rigid cylinder) which then extends away from the substrate. As oxide formation proceeds, Au segregates on the Si side of the Si/silica interface since Au is much less soluble in silica vs. Si. Oxide actually forms all around the reservoir, but growth is fastest at the base because as the wire is formed fresh Si/Au alloy is exposed directly to the oxygen-rich ambient. Evidence for the reservoir has been provided TEM images shown in FIGS. 3B, 3F and elsewhere.

According to the Si/Au equilibrium phase diagram, a maximum of ~15% Si by weight is soluble in Au at 1000° C. However, the nanowire growth system differs from the ideal bulk equilibrium system. In particular, it is observes that in Au/silica nanowires (irrespective of nanosphere radius), the final weight composition is 40-50% Si. This is further evidence that the melting temperature of Au/Si nanostructures is depressed relative to its bulk equilibrium value, though it is possible some additional Si is being supplied in the vapor phase from the substrate. This is vapor liquid solid (VLS) growth because of the presence of the liquid reservoir on top of the nanowire; here the reservoir is consumed during nanowire growth and therefore does not act purely as a catalyst. Unlike size selection by metal-induced crystallization or amorphization which results in 1-2 nm particles, this mechanism relies on metal-induced oxidation, with the resulting nanosphere size being set by a combination of the thermodynamically-controlled oxidation rate and the Si/Au ratio.

Formation of Au Nanospheres in Silica Nanowires

The foregoing has identified mechanisms for nanowire formation exclusively on Si nanostructures. While not wishing to be bound by any theory, the following hypothesizes how Au nanospheres are created. It is hypothesized that a Au/Si filled reservoir facilitates growth of the nanowire through rapid oxidation at the interface between the reservoir and the nanowire, forming a cylindrical oxide shell around a liquid Au/Si dendrite. The high local curvature of the tip of the dendrite depresses the dendrite melting temperature relative to the reservoir melting temperature according to:

$$T(H) = T(H=0) - \frac{2\gamma V^S}{\Delta S} H \quad (2)$$

where $\gamma$ is the surface energy of the liquid-solid interface, $V^S$ is the molar volume of the solid, and $\Delta S$ is $S^L - S^S$, the entropy of fusion. H is the curvature, defined as:

$$H = \frac{1}{2}\left(\frac{1}{r_1} + \frac{1}{r_2}\right). \quad (3)$$

Figure 10A:
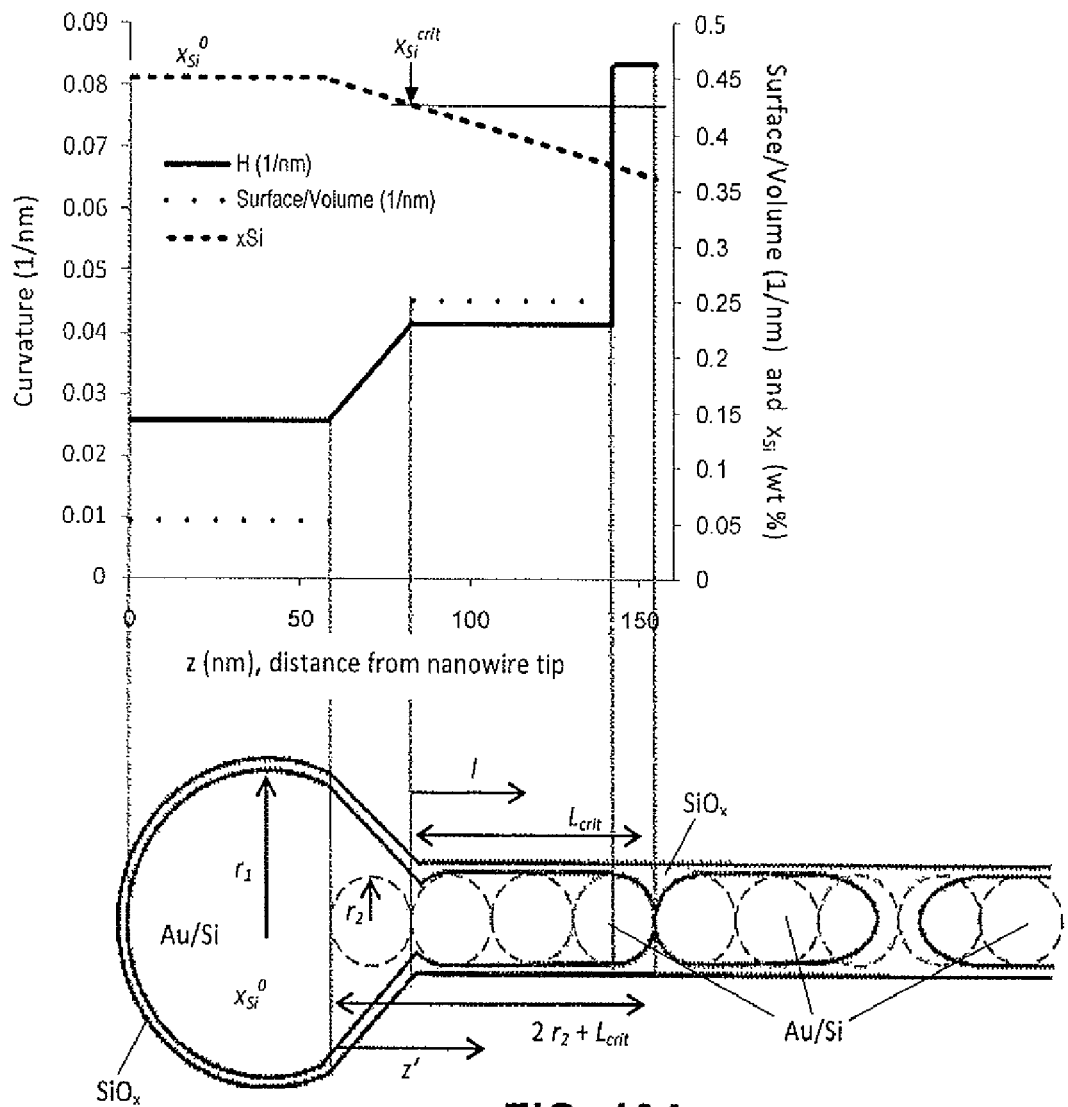
FIGS. 10A and 10B are diagrams depicting nanoparticle formation in a nanowire.

$r_1$ and $r_2$ are radii of curvature along orthogonal axes defined the two-dimensional surface such as a section of a sphere (for the reservoir, or tip of dendrite) or cylinder (for the nanowire). The curvature for a nanowire with 24-nm diameter Au nanospheres is shown in FIG. 10A, where $r_1$ is the radius of the reservoir and $r_2$ is the radius of the nanosphere and tip of the dendrite.

It is believed that the Si content at the tip of the dendrite is also depressed relative to the reservoir, implying a concentration gradient is maintained in the dendrite. Si is reduced preferentially in the dendrite because of the rapid Si oxidation that proceeds all around the dendrite during nanowire growth. The higher surface-to-volume ratio in the cylindrical nanowire vs. the reservoir allows the oxidation-driven nanowire growth process to proceed more rapidly in the dendrite. The shape of the reservoir changes much more slowly.

The existence of a Si concentration gradient in the reservoir and dendrite during nanowire growth is supported by the presence of Au in the final nanowire structure. If, for example, Si in the reservoir could diffuse instantaneously to the growth surface immediately below the reservoir, then the nanowire would be solid silicon oxide and the Au in the reservoir would act exclusively as a catalyst.

It is proposed that the concentration of Si is in the dendrite can be approximated as linear function of the distance, z', from the point when the reservoir begins to taper to the nanowire:

$$x_{Si}(z') = x_{Si}^0 - mz' \quad (4)$$

As shown in FIG. 10A, the length of the taper can be taken to be proportional to the radius of the dendrite, $r_2$. In Eq. (4), $x_{Si}^0$ is the concentration of Si in the reservoir, which we take to be between 40-50 weight percent Si based on Au/Si in the final nanowire structure (and assuming relatively little Si is provided from the vapour phase). In this model, m, the slope of the concentration gradient is proportional to the distance, l, which the dendrite has extended away from the beginning of the reservoir taper, because of the wire's greater surface-to-volume ratio relative to the spherical reservoir. The slope m is inversely proportional to the cross-sectional area of the dendrite since the relative amount of Si consumed is proportional to the amount of Si present in the dendrite at the beginning of the process. Taken together these two assumptions imply, $$m = \frac{cl}{\pi r_2^2} \quad (5)$$

where c is a unitless constant. The value of c has not been experimentally determined, and so the value for nm shown in FIG. 10A is for illustration only. Note, however, that the Si concentration in the reservoir remains constant during growth as both Si and Au are removed at rates which are proportionate to their respective concentrations in the reservoir at the time when nanowire growth is initiated from the Si surface. Also, the slope is independent of the nanowire growth velocity; though there is likely a threshold velocity corresponding to a minimum oxygen concentration in the growth ambient below which Au nanosphere formation will not proceed.

Now the surface energy of the Au/Si alloy in the dendrite will be a function of the Si concentration, since the surface tension of pure Au is significantly higher than the surface energy of Si: 1140×10⁻³ vs. 730×10⁻³ J/m² at their respective melting temperatures. This implies that there is a critical concentration $x_{Si}^{crit}$, at which reduction of dendrite surface/volume ratio becomes energetically favoured compared with cylindrical extension of the dendrite. Reducing the dendrite surface/volume ratio is equivalent to forming a section of a spherical (or more curved) surface at the oxide/dendrite interface, while cylindrical extension of the nanowire is equivalent to maintaining a constant surface-to-volume ratio in the dendrite. This is an unstable equilibrium process: oxidation which locally minimizes the surface area (by beginning the formation of the hemispherical cap) also removes Si, further increasing the energetic driving force per area.

Taking $2r_2+L_{crit}$ as the length, l, of the dendrite at the point when this critical concentration is realized at the edge of the growth surface, then from Eq. 4 and 5:

$$x_{Si}^{crit} = x_{Si}^0 - \left(\frac{c(2r_2 + L_{crit})^2}{\pi r_2^2}\right) \quad (6)$$

Here $2r_2$ is the length of the taper from the spherical reservoir to the growth surface of the nanowire. Experimentally, we observe that $L_{crit}=6r_2$ for all nanowires, so that (6) reduces to:

$$x_{Si}^{crit} = x_{Si}^0 - \frac{64c}{\pi} \quad (7)$$

This value is independent of nanowire geometry and nanowire growth rate, in agreement with our experimental results. Although this analysis assumes a particular length, $2r_2$, for the taper region between nanowire and reservoir, the generality of this result depends only on the physical assumption that the taper length is proportional to the dendrite radius.

Figure 10B:
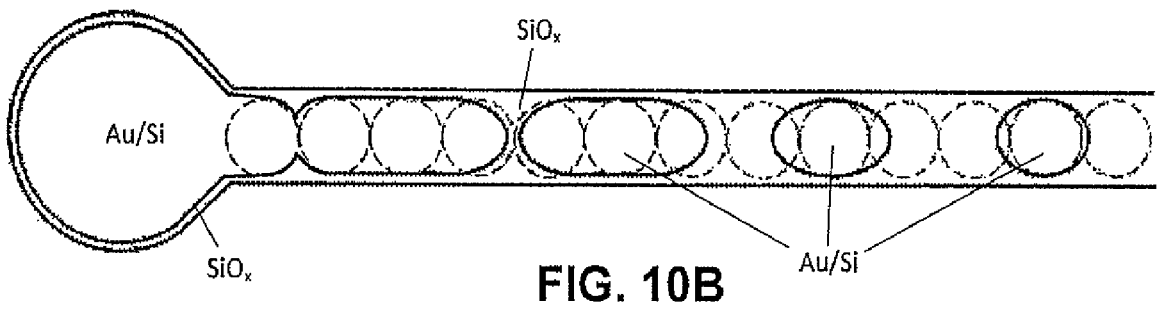

Once the Au/Si alloy in has been isolated from the reservoir by oxidation by the formation of a highly curved, low surface-to-volume ratio oxide cap as described above, then the isolated volume continues to evolve to become a Au sphere, as illustrated in FIG. 10B. The driving force continues to be the reduction of surface energy. The evolution proceeds from the more curved ends of the isolated volume to the center because, relative to the center, the ends are both lower in Si (and therefore higher in surface energy) and more mobile since the locally higher curvature depresses the melting temperature.

In summary, one proposed model for nanosphere formation provides that the higher surface-to-volume ratio in the nanowire enables a Si gradient to exist in a Si/Au dendrite extending from the reservoir, while atomic mobility is increased by curvature-induced melting temperature lowering. Because of the higher surface energy of Au vs. Si, the surface energy of the Au/Si alloy increases at the growth surface when the Si concentration is locally reduced in the dendrite through oxidation. When the dendrite reaches a length corresponding to a (Au-rich) critical Au/Si ratio, then the dendrite is isolated from the reservoir by a curved oxide cap which locally reduces the surface energy by minimizing the surface/volume ratio. This isolated Au/Si volume subsequently evolves to a sphere, consuming the remaining Si by oxidation and minimizing the surface energy of the Au that remains. Simultaneously, nanowire growth and dendrite extension proceed at the base of the reservoir, periodically repeating the nanosphere formation process.

Figure 4A:
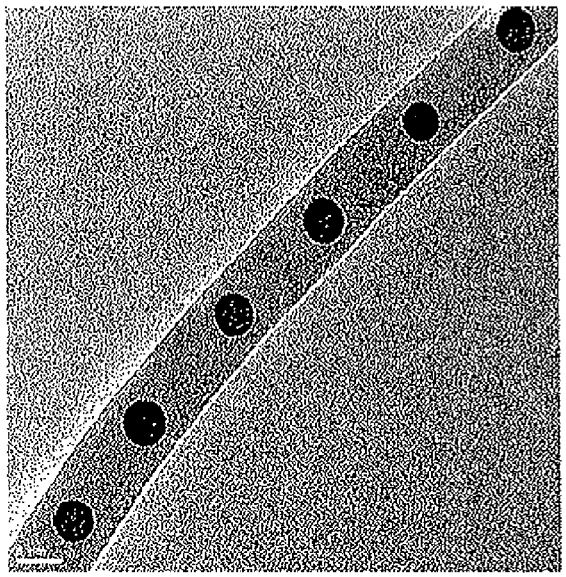
FIG. 4A is a TEM cross-sectional profile of ~5 nm diameter gold nanospheres embedded in $SiO_2$ nanowires.
Figure 4B:
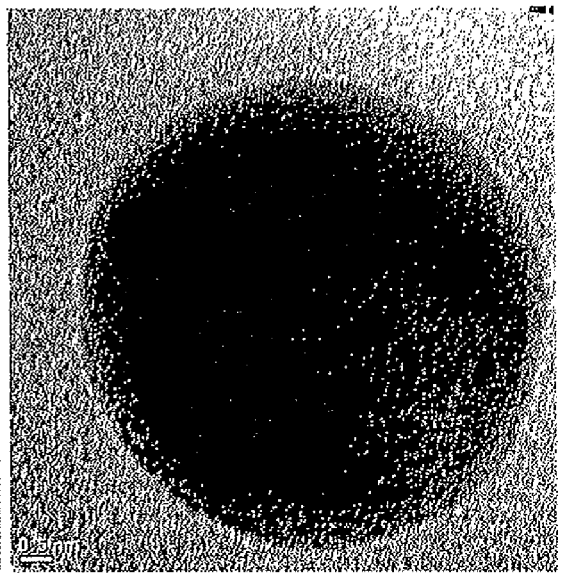
FIG. 4B is an enlarged TEM cross-sectional profile of a single ~5 nm diameter gold nanosphere embedded in a $SiO_2$ nanowire.

FIG. 4A is a TEM cross-sectional profile of ~5 nm diameter gold nanospheres embedded in $SiO_2$ nanowires, FIG. 4B is a higher magnification TEM cross-sectional profile of a single ~5 nm diameter gold nanosphere embedded in an $SiO_2$ nanowire. It can be seen in FIG. 4A that the spacing between the nanospheres in the $SiO_2$ nanowire is about three times the diameter of one nanosphere. Accordingly, in some approaches, the spacing between the metallic spheres is about an integer multiple of the mean diameter of the spheres. In other approaches, the spheres in the nanowire may have a spacing of between about 1× and about 5× the average diameter of the spheres.

Figure 4C:
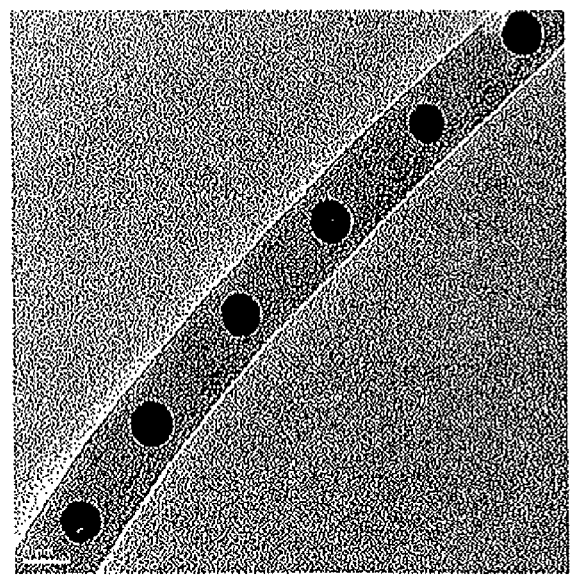
FIG. 4C is a TEM cross-sectional profile of ~25 nm diameter gold nanospheres embedded in $SiO_2$ nanowires.
Figure 4D:
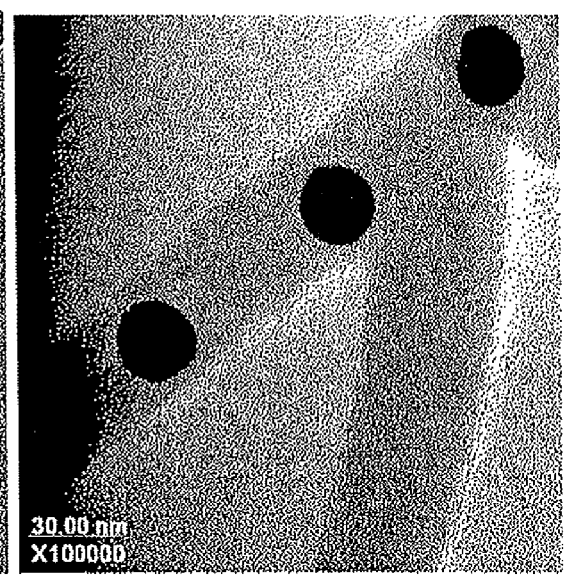
FIG. 4D is an enlarged TEM cross-sectional profile of ~25 nm diameter gold nanospheres embedded in $SiO_2$ nanowires.

FIG. 4C is a TEM cross-sectional profile of ~25 nm diameter gold nanospheres embedded in $SiO_2$ nanowires. FIG. 4D is a higher magnification TEM cross-sectional profile of ~25 nm diameter gold nanospheres embedded in $SiO_2$ nanowires. Even with ~25 nm diameter nanospheres, the spacing between the nanospheres in the nanowire is about three times the diameter of one nanosphere. In other approaches, the spheres in the nanowire may have a spacing of between about 1× and about 5× the average diameter of the spheres.

In another approach, and in no way limiting the scope of the invention, nanowires can be selectively grown from the Au/Si alloy using shadow evaporation. Nanowire growth occurs in an environment including both silicon nanostructures and gold or other metallic films. The nanostructures can be formed in either a conventional silicon substrate, a silicon on insulator (SOI) substrate, or any other substrate capable of promoting nanowire growth. The gold or metallic film can be deposited in selected regions through many methods, one of which, shadow evaporation, is identified in FIGS. 5A-5D.

Figure 5A:
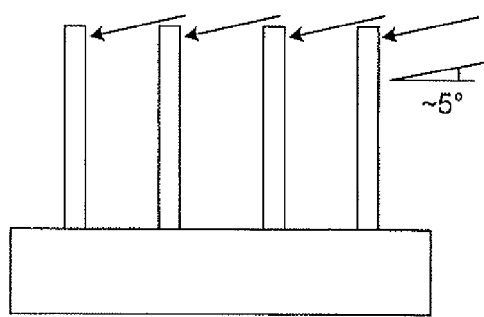
FIG. 5A is a schematic diagram illustrating shadow evaporation onto silicon nanostructures at ~5° angle according to one embodiment.
Figure 5B:
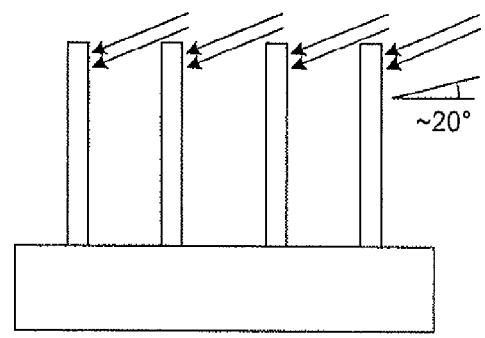
FIG. 5B is a schematic diagram illustrating shadow evaporation onto silicon nanostructures at ~20° angle according to one embodiment.
Figure 5C:
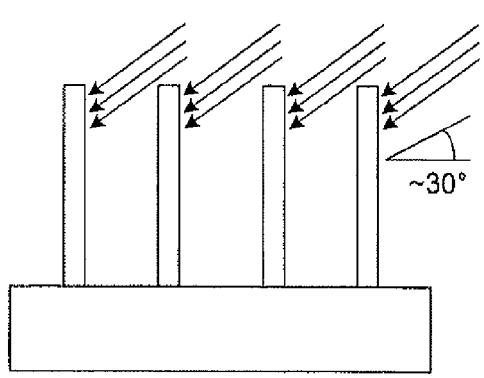
FIG. 5C is a schematic diagram illustrating shadow evaporation onto silicon nanostructures at ~30° angle according to one embodiment.
Figure 5D:
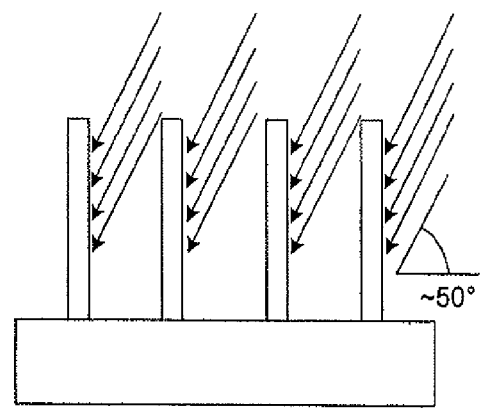
FIG. 5D is a schematic diagram illustrating shadow evaporation onto silicon nanostructures at ~50° angle according to one embodiment.

For illustrative purposes and in no way meant to be limiting, FIG. 5A shows one embodiment using gold as the metal and silicon as the substrate. FIG. 5A illustrates that by evaporating gold films on the nanostructured silicon substrate for an angle of about 5°, a highly selective directional growth can be achieved. This highly selective directional growth may also be accomplished for other angles (up to about 90°). FIGS. 5B, 5C, and 5D illustrate angles of about 20°, about 30°, and about 50°, respectively. This approach has an advantage of not requiring additional lithography steps.

In another approach, the size distribution and separation can be achieved through a combination of varying gold or metallic film thickness (about 0.1 nm to about 25 nm) and silicon or other substrate linewidths.

Figure 6A:
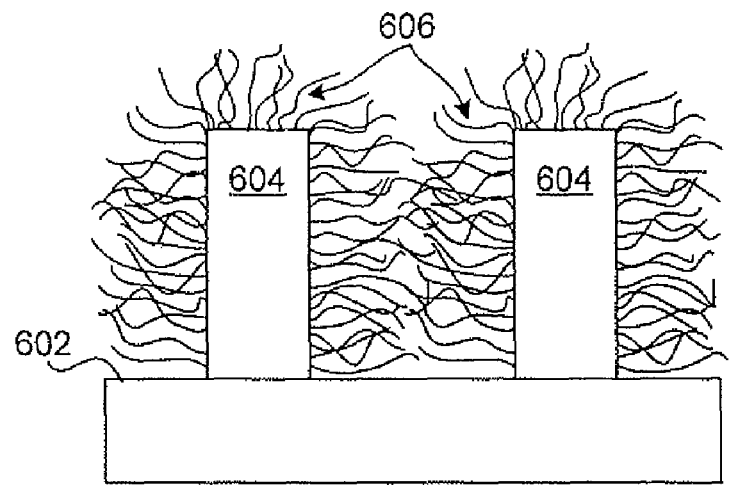
FIG. 6A is a schematic diagram of selective nanowire growth using an inhibiting oxide layer according to one embodiment.
Figure 6B:
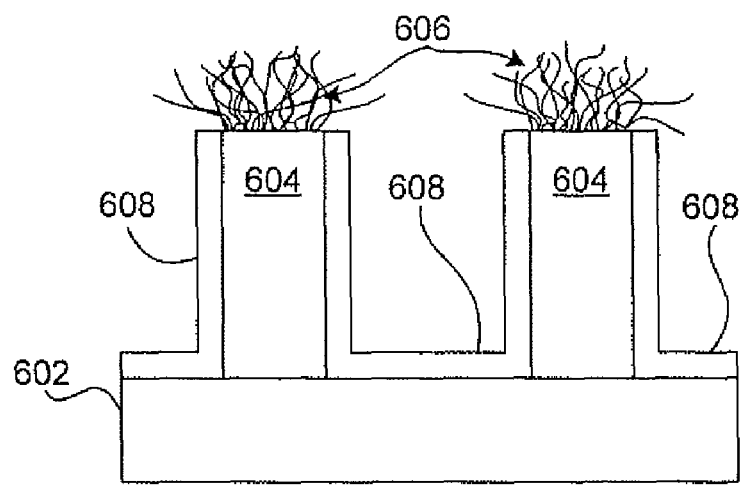
FIG. 6B is a schematic diagram of selective nanowire growth using an inhibiting oxide layer according to one embodiment.
Figure 6C:
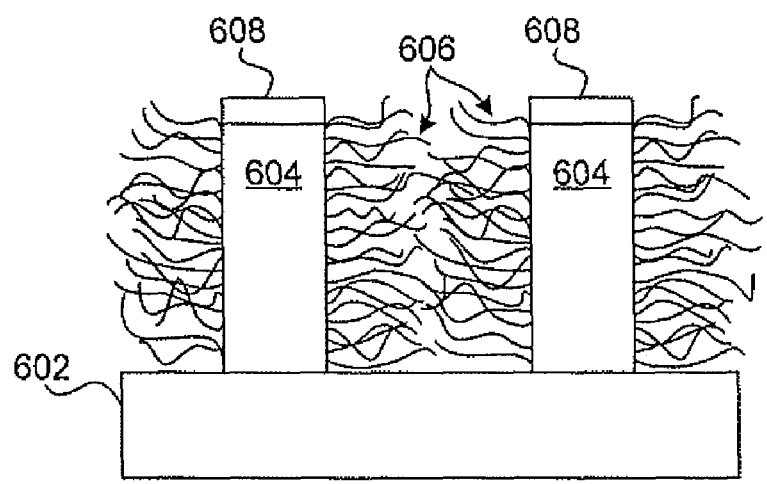
FIG. 6C is a schematic diagram of selective nanowire growth using an inhibiting oxide layer according to one embodiment.

FIGS. 6A-6C illustrate another approach through which nanowire growth can be controlled through selective placement of oxide films 608. For illustrative purposes, FIGS. 6A-6C show one embodiment using gold as the metal and silicon as the substrate, which in no way limits the scope of the invention. In FIG. 6A, a silicon substrate 602 has silicon nanoscale structures 604 protruding therefrom. Each of these silicon nanoscale structures 604 has a plethora of Au/SiO2 nanowires 606 growing on the surface in a non-selective pattern.

The oxide films may be any type of oxide, but in a preferred embodiment it is a silicon oxide. Also, an electric field may be used to direct growth of the nanowires in a preferred direction.

In FIG. 6B, the silicon substrate 602 and the side surface portions of the silicon nanoscale structures 604 are covered with an oxide film 608 to stunt nanowire 606 growth. In FIG. 6B, the nanowires 606 only grow from the top surface portions of the silicon nanostructures 604.

In another approach, the oxide film 608 only covers the side surface portions of the silicon nanoscale structures 604 and not any of the silicon substrate 602.

In FIG. 6C, the top portions of the silicon nanoscale structures 604 are covered with an oxide film 608 to stunt nanowire 606 growth. In FIG. 6C, the nanowires 606 only grow from the side surface portions of the silicon nanostructures 604.

On such structures as illustrated in FIGS. 6A-6C, isotropically deposited gold island films will lead to isotropic growth as shown in FIG. 6A, or on the top as in FIG. 6B, or only in the region between grating lines as shown in FIG. 6C.

Figure 6D:
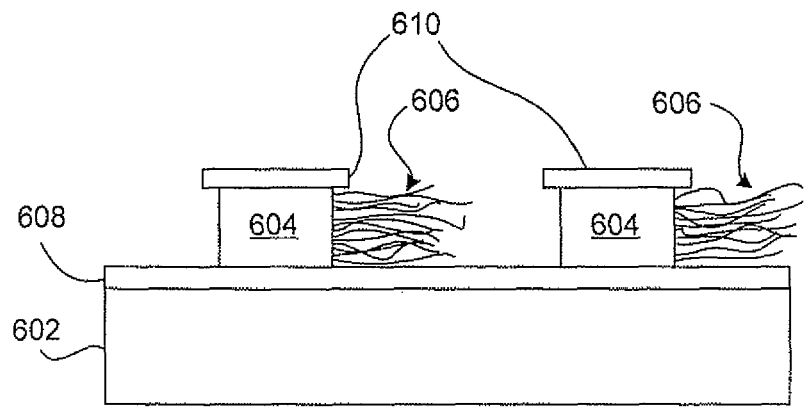
FIG. 6D is a schematic diagram of selective nanowire growth using lithography for structures in silicon on insulator (SOI) configuration according to one embodiment.

In yet another approach, lithography may be used to deposit gold films in selected regions. FIG. 6D illustrates a cross-sectional view of this approach for structures made in SOI configuration. In FIG. 6D, silicon substrate 602 has an oxide film 608 deposited on a surface thereof. Silicon nanoscale structures 604 protrude from this surface, with oxide etch masks 610 on each silicon nanoscale structure 604. Shadow evaporation is used to ensure nanowire 606 growth along one side only. This method may be used for formation of nanoparticle gate regions.

Figure 6E:
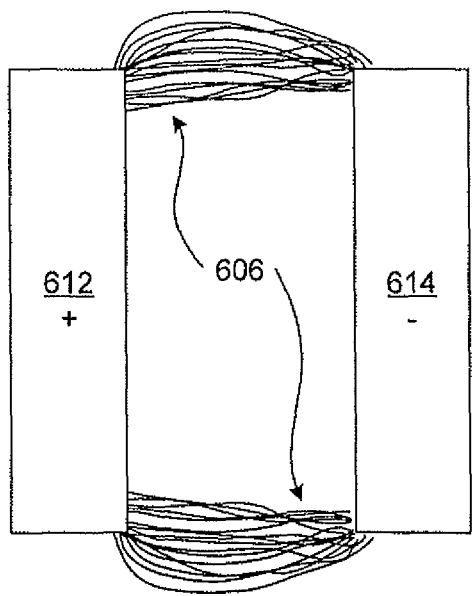
FIG. 6E is a top view of a schematic diagram of selective nanowire growth using lithography for structures in SOI configuration according to one embodiment.

FIG. 6E is a schematic illustration of a top view of another approach. In this configuration, a first substrate 612 is positively charged and a second substrate 614 is negatively charged producing an electric field between the first and second substrates. Nanowires 606 tend to grow along the electric field lines, and this effect is intensified around the corners of the substrates, as shown by the nanowire 606 growth isolated to the corner regions following normal electric field lines.

Figure 6F:
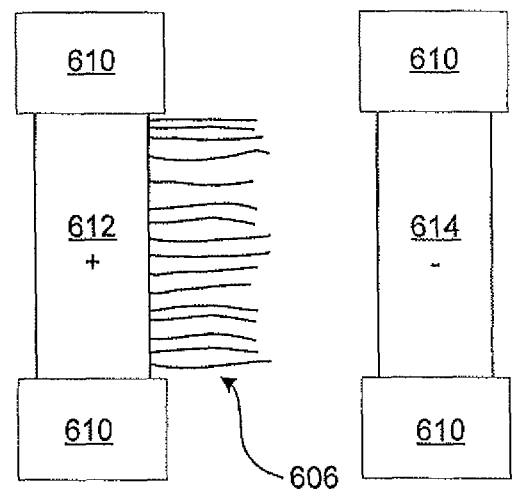
FIG. 6F is a top view of a schematic diagram of one embodiment which can be used to synthesize straighter nanowires.

FIG. 6F shows a schematic illustration of one embodiment which can be used to synthesize straighter nanowires. In FIG. 6F, a first substrate 612 is positively charged and a second substrate 614 is negatively charged producing an electric field between the first and second substrates. Since nanowires 606 tend to grow along the electric field lines more strongly around the corners, masks 610 are placed over the corner areas of the substrates 612 and 614 to either keep metal from being deposited in the film in these areas or placed before nanostructures are formed to inhibit nanostructure formation, since metal and nanostructures should be present to promote nanowire 606 growth.

Figure 7:
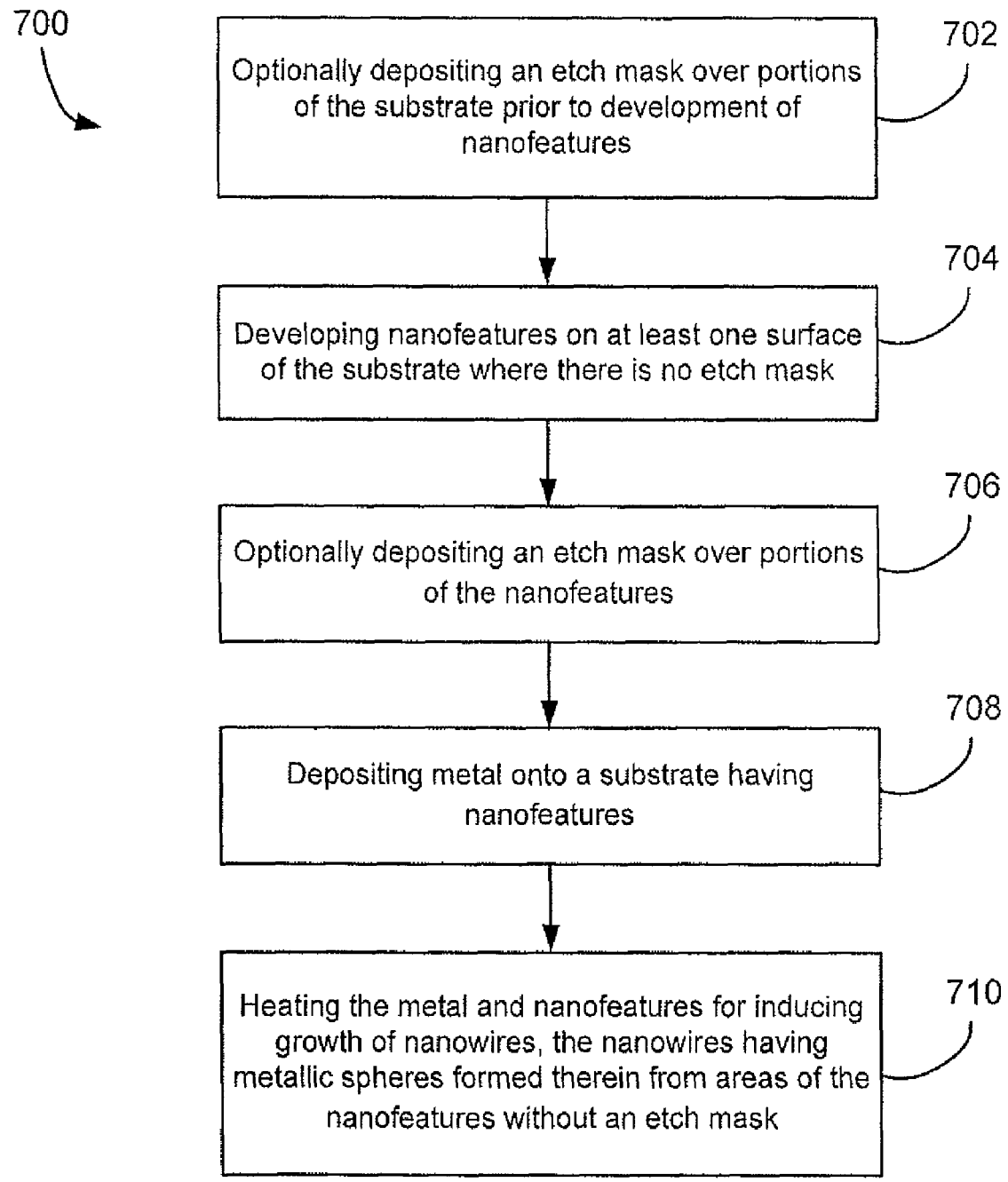
FIG. 7 is a flow diagram of a process according to one embodiment.

Now referring to FIG. 7, a method 700 for forming a nanostructure and growing nanowires according to one embodiment is shown. In operation 702, an etch mask is optionally deposited over portions of the substrate prior to development of nanofeatures. In operation 704, nanofeatures are developed on at least one surface of the substrate where there is no etch mask. In operation 706, an etch mask is optionally deposited over portions of the nanofeatures. In operation 708, metal is deposited onto a substrate having nanofeatures. In operation 710, the metal and nanofeatures are heated for inducing growth of nanowires, the nanowires having metallic spheres formed therein from areas of the nanofeatures without an etch mask.

In another approach, the metal may be gold, silver, palladium, copper, etc., the nanowires may be grown in air, and the nanostructures may be silicon or another material which can promote growth of nanowires therefrom.

In another approach, the substrate may comprise an oxide- or nitride-forming material, or may comprise silicon. In addition, the nanowires may comprise material from the substrate, or an electrically insulative material at least partially surrounding the metallic spheres.

In another approach, the metal may be deposited by shadow evaporation or by covering selected areas of the nanofeatures, since the nanowires tend to grow only from areas of the nanofeatures that are not covered. Also, the growth of the nanowires may be directed by applying an electric field.

Figure 8A:
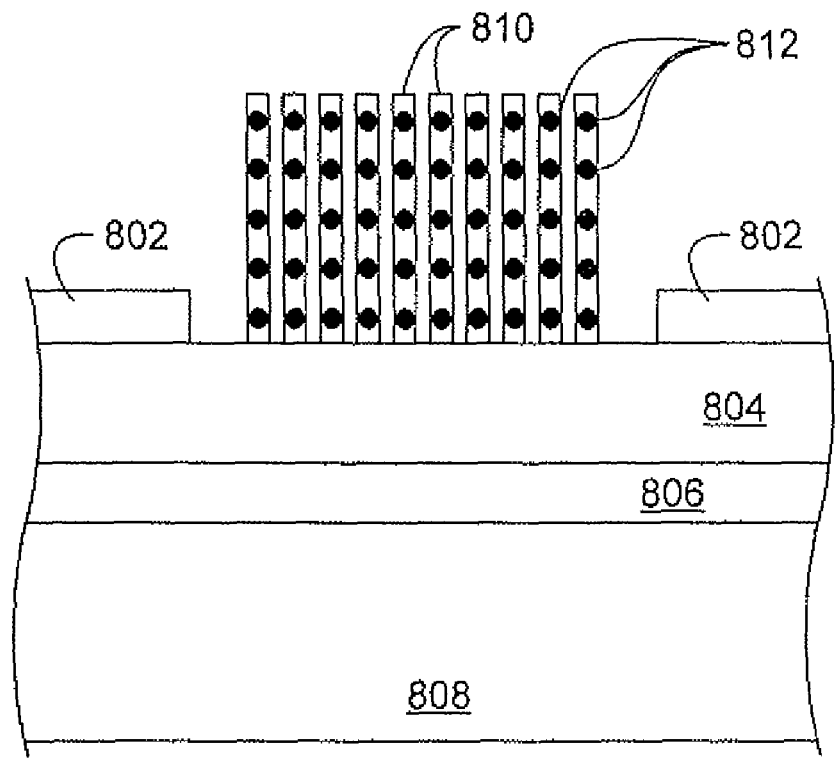
FIG. 8A is a schematic diagram of a silicon substrate with vertically grown $SiO_2$ nanowires with embedded gold nanoparticles to measure current-voltage according to one embodiment.
Figure 8B:
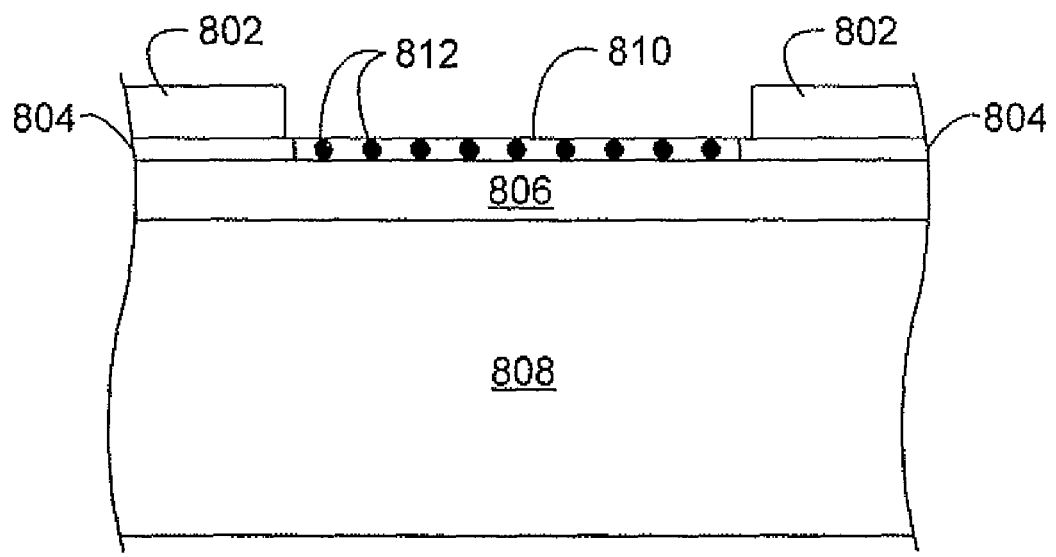
FIG. 8B is a schematic diagram of a silicon substrate with horizontally grown $SiO_2$ nanowires with embedded gold nanoparticles to measure current-voltage according to one embodiment.

In a further approach, as illustrated in FIGS. 8A and 8B, which are cross-sectional views of current-voltage measurement devices, several features (particularly from the perspective of advanced electronic device applications) may be revealed through current-voltage measurements. For illustrative purposes, FIGS. 8A and 8B show one particular embodiment using gold as the metal and silicon as the substrate, which in no way should be construed to limit the scope of the invention. In FIG. 8A, a silicon wafer 808 has an oxide layer 806 and a further silicon substrate 804. Extending from outside this silicon substrate 804 toward the oxide layer 806 are a multitude of vertically grown $SiO_2$ nanowires 810 with embedded gold nanospheres 812 therein. Also, on the top of the silicon substrate 804 there are metal contacts 802.

For current-voltage measurements, SOI substrates may have large (e.g., about 1.5 μm) and small (e.g., about 0.2 μm) top silicon 804 thickness. FIG. 8A is a schematic of a terminal device configuration where the $SiO_2$ nanowires 810 with embedded gold nanospheres 812 may be grown vertically.

In another approach, as shown in FIG. 8B, the $SiO_2$ nanowires 810 with embedded gold nanospheres 812 may be grown horizontally.

Figure 9A:
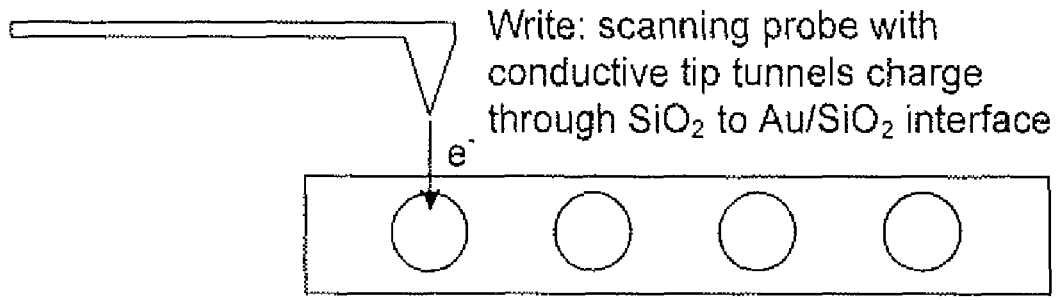
FIG. 9A is a schematic diagram of a writing operation in advanced electronic memory storage according to one embodiment.
Figure 9B:
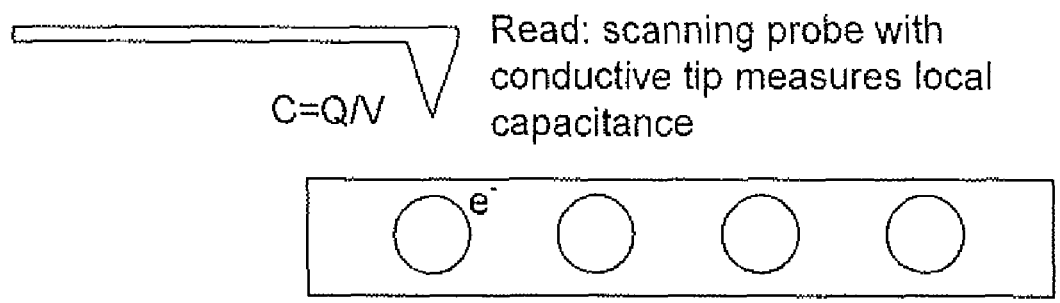
FIG. 9B is a schematic diagram of a reading operation in advanced electronic memory storage according to one embodiment.
Figure 9C:
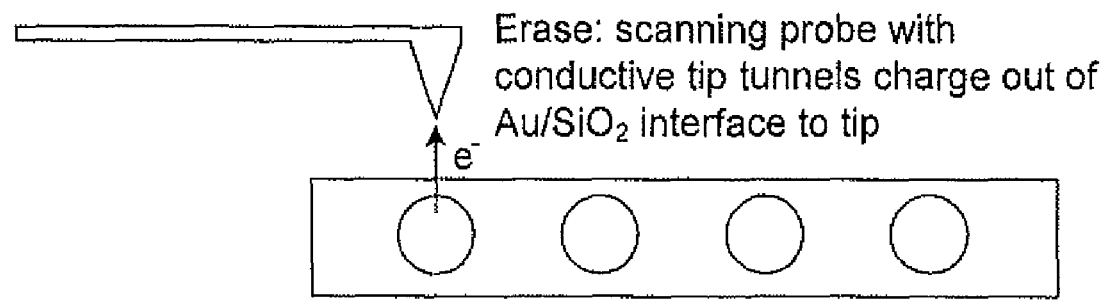
FIG. 9C is a schematic diagram of an erasing operation in advanced electronic memory storage according to one embodiment.

Another embodiment comprising advanced electronic memory is shown in FIGS. 9A-9C. For illustrative purposes, FIGS. 9A-9C show one embodiment using gold as the metal and silicon as the substrate, which in no way should limit the scope of the invention. FIG. 9A is a diagram of a writing operation for advanced electronic memory storage. This electronic memory storage could be capable of <100 nm Au separation with >1 Gbit/cm$^2$ memory capacity. In FIG. 9A, a writing operation is shown where a scanning probe with a conductive tip tunnels charge through a $SiO_2$ nanowire to the Au/$SiO_2$ interface. The scanning probe may then move to the next gold nanoparticle to repeat the writing operation, or perform a different operation. Accordingly, the binary state, e.g., "0" and "1", may be correlated with the charge (or absence thereof) of each particular nanosphere.

In another approach, during a writing operation, the charge is drained from one or more of the selected nanospheres, thereby changing the binary state associated with the nanosphere(s).

In FIG. 9B, a reading operation is shown where a scanning probe with conductive tip measures the local capacitance of a $SiO_2$ nanowire with embedded gold nanospheres. The scanning probe may then move to the next gold nanoparticle to repeat the reading operation, or perform a different operation.

In a preferred embodiment, during a reading operation, the presence of a charge may indicate a binary value such as "1", while the absence of a charge may indicate a binary value such as "0."

In FIG. 9C, an erasing operation is shown where a scanning probe with conductive tip tunnels charge out of the Au/$SiO_2$ interface to the tip. The scanning probe may then move to the next gold nanoparticle to repeat the erasing operation, or perform a different operation. Overwriting may also be performed by selective writing and erasing.

In another approach, a number of scanning probes may perform multiple functions at once across multiple $SiO_2$ nanowires with embedded gold nanospheres.

In yet another approach, the $SiO_2$ nanowires have embedded nanospheres of a metal other than gold.

In another approach, because of the inherent regularity of the gold nanosphere diameters and the interparticle spacing, the $SiO_2$/Au nanowires may be implemented as a nanoscale length or particle size standard.

In another embodiment, the $SiO_2$/Au nanowires may be used for photoluminescence since the $SiO_2$/Au nanowires emit a low intensity but distinct photoluminescence (PL) band peaking at approximately 440 nm with 350 and 400 nm excitation. In addition, this process may be activated electronically, and these optical transitions could be used as part of a detector.

In another approach, nanoparticles decorated with biologically active molecules (see, e.g., Mirkin, U.S. Pat. No. 6,861,221, which is herein incorporated by reference to the extent it is nonlimiting and illustrative of nanoparticles decorated with biologically active molecules) can be effective as therapeutic or characterization elements, or as markers in living systems for imaging. In some cases, it may be advantageous to have several linearly aligned nanoparticles, for example if multiple proteins must be accessed simultaneously. In these cases, the surfaces of the metal nanospheres could be partially exposed from the insulating nanowire by etching to allow for precise control of the positioning of the bioactive molecule on the metal nanospheres.

In another embodiment, etching may be used to fully reduce the thickness of a material surrounding nanowires with embedded nanospheres. The resulting nanoparticles may be useful in many applications such as medical applications. Further, biologically active molecules may be added to such nanoparticles.

In another approach, the etching may be used to reduce the thickness of a material, such as an oxide, surrounding gold nanospheres partially, leaving a minority, a majority, or all of surface areas of the gold nanospheres covered by the oxide after the etching. In some cases, such etching may create nanoparticle precursors (e.g., nanowires of reduced thickness) that may be mechanically or chemically altered (e.g., mechanically crushed) to create nanoparticles from the precursors.

The reduction in the thickness of a material surrounding nanospheres is particularly useful when gold nanospheres are to be used in medical applications, as gold particles tend to agglomerate in the body. By leaving a layer of material, such as a silicon-containing material, on some or all of the surface area of the nanospheres, the tendency to agglomerate may be reduced. Further, biologically active molecules may be added to such nanoparticles.

Controllable nanoparticle and nanowire synthesis enhances the creation and operation of a wide range of optical, biological, chemical, and electronic devices. For example, brilliant colors in stained glass windows trace their origins to strong electromagnetic interactions of noble metal nanoparticles. By controlling size and shape of nanoparticles, applications such as color filters, surface Plasmon devices, chemical sensing devices, light emitting devices, and advanced (MOS) memory devices may be developed. Similarly, ability to synthesize nanowires provides control of optical and electrical properties in a wide range of material systems. For example, amorphous silicon oxide nanowires prepared through laser ablation exhibit strong blue luminescence.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A nanostructure, comprising:
    a substrate having an area with a nanofeature;
    a nanowire extending from the nanofeature, the nanowire having metallic spheres formed therein, the spheres being characterized as having at least one of about a uniform diameter and about a uniform spacing there between, wherein the metallic spheres are completely encapsulated in the nanowire.

2. The nanostructure of claim 1, wherein the spheres comprise gold.

3. The nanostructure of claim 1, wherein the spheres comprise palladium.

4. The nanostructure of claim 1, wherein the nanowire comprises an electrically insulative material at least partially surrounding the metallic spheres.

5. The nanostructure of claim 4, wherein the electrically insulative material is an oxide or a nitride.

6. The nanostructure of claim 4, wherein the electrically insulative material is a silicon oxide.

7. The nanostructure of claim 1, wherein the spheres have a spacing of between about 1× and about 5× an average diameter thereof.

8. The nanostructure of claim 1, wherein a spacing between the metallic spheres is fixed.

9. The nanostructure of claim 1, wherein the substrate comprises an oxide- or nitride-forming material.

10. The nanostructure of claim 9, wherein the substrate comprises silicon.

11. The nanostructure of claim 9, wherein the nanowires comprise material from the substrate.

12. The nanostructure of claim 1, wherein the metallic spheres have about a uniform diameter relative to each other.

13. A method for forming a nanostructure, the method comprising:
    depositing metal onto a substrate having nanofeatures;
    heating the metal and nanofeatures for inducing growth of nanowires, the nanowires extending from the nanofeatures, the nanowires having metallic spheres formed therein, the spheres being characterized as having at least one of about a uniform diameter and about a uniform spacing, there between, wherein the metallic spheres are completely encapsulated in the nanowires.

14. The method of claim 13, wherein the growth is conducted in air.

15. The method of claim 13, wherein the metal comprises gold.

16. The method of claim 13, wherein the metal comprises palladium.

17. The method of claim 13, wherein the substrate comprises an oxide- or nitride-forming material.

18. The method of claim 17, wherein the substrate comprises silicon.

19. The method of claim 17, wherein the nanowires comprise material from the substrate.

20. The method of claim 13, wherein the nanowires comprise an electrically insulative material at least partially surrounding the metallic spheres.

21. The method of claim 13, wherein the metal is deposited by shadow evaporation.

22. The method of claim 13, further comprising covering areas of the nanofeatures, the nanowires growing from areas of the nanofeatures that are not covered.

23. The method of claim 13, further comprising applying an electric field for directing a direction of growth of the nanowires.

24. A method for reading and writing data, the method comprising:
    during a write operation, in a nanostructure comprising a substrate having an area with a nanofeature and a nanowire extending from the nanofeature, the nanowire having metallic spheres formed therein, the spheres being characterized as having at least one of about a uniform diameter and about a uniform spacing there between, wherein the metallic spheres are completely encapsulated in the nanowire the nanowire being electrically insulating, applying a charge to selected spheres; and during a read operation, detecting presence or absence of a charge on the metallic spheres, the presence of a charge being associated with one binary value, the absence of a charge being associated with another binary value.

25. The method of claim 24, further comprising, during another write operation, draining the charge from one or more of the selected spheres.

26. A method for preparing nanoparticles, the method comprising:

etching a nanowire having been formed on a substrate having an area with a nanofeature and the nanowire extending from the nanofeature, the nanowire having metallic spheres formed therein, the spheres being characterized as having at least one of about a uniform diameter and about a uniform spacing there between, wherein the metallic spheres are completely encapsulated in the nanowire, the etching at least partially reducing a thickness of the nanowire, thereby forming nanoparticles or nanoparticle precursors.

27. The method of claim 26, wherein the metallic spheres comprise gold, wherein the material is an oxide, wherein the etching reduces a thickness of the material, wherein a majority of surface areas of the spheres remains covered by the material after the etching.

28. The method of claim 26, further comprising adding biologically active molecules to the nanoparticles or nanoparticle precursors.

29. A nanostructure, comprising:

a nanowire having metallic spheres formed therein, the spheres being characterized as having at least one of about a uniform diameter and about a uniform spacing there between, the nanowire having a solid cross section, wherein the metallic spheres are completely encapsulated in the nanowire.

30. The nanostructure of claim 29, wherein a spacing between the metallic spheres is about an integer multiple of a mean diameter of the spheres.

31. The nanostructure of claim 29, wherein a spacing between the metallic spheres is fixed.

32. The nanostructure of claim 29, wherein the nanowire comprises an electrically insulative material at least partially surrounding the metallic spheres.

33. The nanostructure of claim 29, wherein the metallic spheres have about a uniform diameter relative to each other.

* * * * *